US009983239B2

(12) United States Patent
Mayell

(10) Patent No.: US 9,983,239 B2
(45) Date of Patent: May 29, 2018

(54) INTEGRATED LINEAR CURRENT SENSE CIRCUITRY FOR SEMICONDUCTOR TRANSISTOR DEVICES

(71) Applicant: Power Integrations, Inc., San Jose, CA (US)

(72) Inventor: Robert Mayell, Los Altos, CA (US)

(73) Assignee: Power Integrations, Inc., San Jose, CA (US)

(*) Notice: Subject to any disclaimer, the term of this patent is extended or adjusted under 35 U.S.C. 154(b) by 154 days.

(21) Appl. No.: 15/154,702

(22) Filed: May 13, 2016

(65) Prior Publication Data

US 2017/0328934 A1 Nov. 16, 2017

(51) Int. Cl.
*G01R 1/20* (2006.01)
*G01R 19/00* (2006.01)
*H01L 27/06* (2006.01)
*H01L 29/778* (2006.01)
*H01L 29/20* (2006.01)

(52) U.S. Cl.
CPC ...... *G01R 19/0092* (2013.01); *H01L 27/0623* (2013.01); *H01L 29/2003* (2013.01); *H01L 29/778* (2013.01)

(58) Field of Classification Search
CPC .. G01R 1/203; G01R 15/146; G01R 19/0007; G01R 1/22; G01R 1/20
See application file for complete search history.

(56) References Cited

U.S. PATENT DOCUMENTS

| 4,553,084 A | 11/1985 | Wrathall |
| 4,951,102 A | 8/1990 | Beitman |
| 5,821,580 A | 10/1998 | Kuwahara |
| 6,573,558 B2 | 6/2003 | Disney |
| 7,554,152 B1 | 6/2009 | Ranucci et al. |
| 8,022,456 B2 | 9/2011 | Parthasarathy |
| 9,152,163 B1 | 10/2015 | Tabbro et al. |
| 9,195,252 B1 | 11/2015 | Tanase |

(Continued)

FOREIGN PATENT DOCUMENTS

| JP | S062114459 | 5/1987 |
| JP | H06045602 | 2/1994 |

(Continued)

OTHER PUBLICATIONS

Niu et al. "Sensing Power MOSFET Junction Temperature Using Gate Drive Turn-On Current Transient Properties" IEEE Energy Conversion Congress and Exposition (ECCE), IEEE Sep. 14, 2014 pp. 2909-2916.

*Primary Examiner* — Tung X Nguyen
(74) *Attorney, Agent, or Firm* — The Law Offices of Bradley J. Bereznak

(57) ABSTRACT

An integrated circuit (IC) for sensing a current flowing through a transistor device includes a substrate and a current scaling circuit that includes first and second MOSFET devices. The first MOSFET device has a drain coupled to the switched FET at a first node and a source coupled to the substrate. The second MOSFET device has a source coupled to the substrate and a drain coupled to a second node. The first MOSFET device has a channel size that is K times larger than the second MOSFET device. Circuitry is included that equalizes a voltage across both the first MOSFET device and the second MOSFET device.

20 Claims, 3 Drawing Sheets

(56) References Cited

U.S. PATENT DOCUMENTS

| | | |
|---|---|---|
| 9,293,535 B2 | 3/2016 | Wang et al. |
| 2004/0227545 A1 | 11/2004 | Nadd et al. |
| 2005/0167742 A1 | 8/2005 | Challa et al. |
| 2005/0167749 A1 | 8/2005 | Disney |
| 2005/0218963 A1 | 10/2005 | Ball |
| 2008/0197396 A1 | 8/2008 | Parthasarathy |
| 2008/0197397 A1 | 8/2008 | Parthasarathy et al. |
| 2008/0197406 A1 | 8/2008 | Parthasarathy et al. |
| 2011/0248702 A1* | 10/2011 | Kume ............... G01R 19/0092 324/119 |
| 2013/0093404 A1* | 4/2013 | Park ...................... H02M 1/32 323/273 |
| 2013/0332750 A1 | 12/2013 | Souma |
| 2014/0070313 A1 | 3/2014 | Wang et al. |
| 2016/0013765 A1 | 1/2016 | Vincenzo |
| 2016/0056138 A1 | 2/2016 | Shibib |

FOREIGN PATENT DOCUMENTS

| | | |
|---|---|---|
| JP | H06334189 | 12/1994 |
| JP | H08139200 | 5/1996 |
| JP | H09213926 | 8/1997 |
| JP | H10256541 | 9/1998 |
| JP | 2009081381 | 4/2009 |

\* cited by examiner

INTEGRATED LINEAR CURRENT SENSE CIRCUITRY FOR SEMICONDUCTOR TRANSISTOR DEVICES

TECHNICAL FIELD

This application relates generally to current sense techniques in semiconductor switching devices; more specifically, to sensing current from a gallium nitride (GaN) normally ON high electron mobility field-effect transistor (HEMFET) device

BACKGROUND

There are known methods of current sensing in semiconductor telling devices. For example, a simple current-sensing circuit utilizes a sense resistor connected in series in the current-flow path, wherein the voltage drop across the sense resistor is linearly proportional to the current. However, the power loss in the sense resistor, and source voltage variations versus switch currents makes this method unacceptable for certain types of high-performance power converter devices requiring high efficiencies.

Another common method of current sensing is by utilizing the known switch drain-to-source conduction resistance, known as $R_{DS(on)}$. Switching devices (e.g., MOSFETs) in power supply circuits typically transfer the current from the input supply to the output load. When the switches conduct current they have a characteristic series resistance that may be used as series sense resistors. The current can therefore be inferred by sensing the voltage across the switch and knowing its characteristics impedance, i.e., $I_D=V_{DS}/R_{DS(on)}$. When the switch is conducting and the voltage across it is therefore small, the MOSFET is in its normal on-state region and acts like a linear resistor.

Yet another known technique of current sensing is through the internally built-in sense FET that is defined by sensing the current through a small fraction of the conduction channel (drift region) of the main switch. If the power switch is on-chip, the tolerance of sensing the current through the MOSFET is improved by using a smaller, matched sense FET (e.g., in a current-mirror configuration). The gate-source and drain-source voltages of both the main power FET and sense FET are made equal by shorting main-drain to sense-drain and main-source to sense-source. Drain current, $I_D$, is a function of gate-source voltage, $V_{GS}$, and drain-source voltage, $V_{DS}$; hence the corresponding current densities are equal. That means that if the sense FET is a N-times smaller channel but matched device, its current is linearly proportional and N times smaller than the current flowing through the power device (N~1000 to 10,000).

The sense FET approach to sensing current is generally more accurate then other prior art techniques, but it still has drawbacks. For instance, accuracy of the sense FET approach is limited by the matching performance of the sense and power FETs, which tends to degrade with larger values of N. In addition, like $R_{DS(on)}$ sensing, the sense FET approach requires a sample-and-hold capacitor to hold the sensed current as a voltage during off times. Noise may be introduced due to transient spikes that may occur across the capacitor.

BRIEF SUMMARY

An integrated circuit (IC) is provided for sensing a main current flowing through a transistor device. The IC includes a substrate and a current scaling circuit that includes first and second MOSFET devices. The first MOSFET device has a drain coupled to the transistor device at a first node and a source coupled to the substrate. The second MOSFET device has a source coupled to the substrate and a drain coupled to a second node. The first and second MOSFET devices each have a gate that is commonly coupled to receive a gate drive signal. The first MOSFET device has a channel size that is K times larger, where K is an integer greater than 1, as compared to the second MOSFET device. Circuitry is included that equalizes a voltage across both the first MOSFET device and the second MOSFET device, thereby producing a current ratio of K:1 between the first and second MOSFET devices in operation. Circuitry coupled to the first and second nodes equalizes a voltage across both the first MOSFET device and the second MOSFET device.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
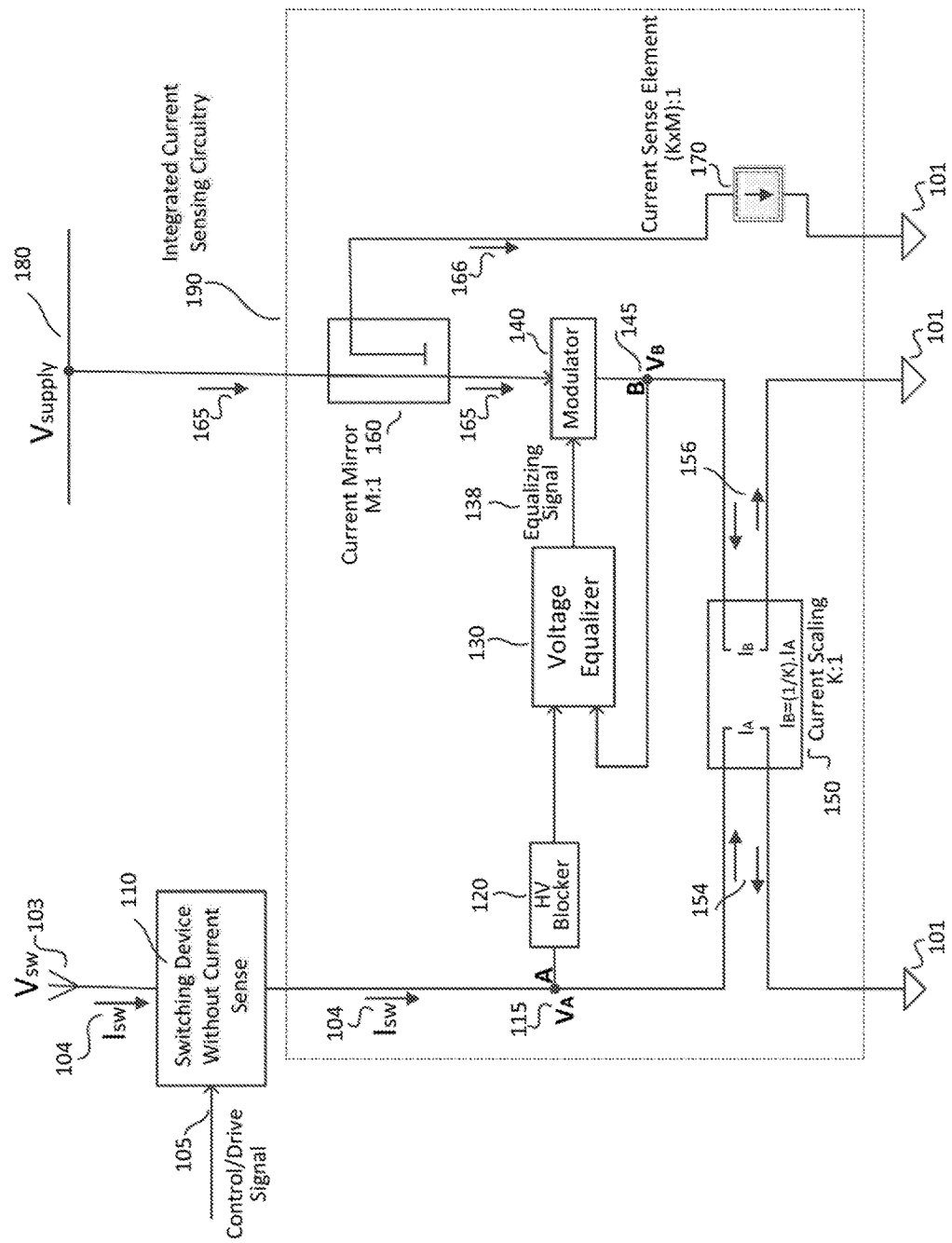
FIG. 1 is a circuit block diagram of an example current sensing circuit having a continuous linear-sensed current response.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description specific details are set forth, such as device types, voltages, component values, circuit configurations, etc., in order to provide a thorough understanding of the embodiments described. However, persons having ordinary skill in the relevant arts will appreciate that these specific details may not be needed to practice the embodiments described. It is further appreciated that well known circuit structures and elements have not been described in detail, or have been shown in block diagram form, in order to avoid obscuring the embodiments described.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art.

In the context of the present application, when a transistor is in an "off state", or "off", the transistor does not substantially conduct current. Conversely, when a transistor is in an "on state", or "on", the transistor is able to substantially conduct current. By way of example, in one embodiment, a high-voltage transistor comprises an N-channel metal-oxide-semiconductor field-effect transistor (NMOS) with the high-voltage being supported between the first terminal, a drain, and the second terminal, a source. The high voltage MOSFET comprises a power switch that is driven by an integrated controller circuit to regulate energy provided to a load. For purposes of this disclosure, "ground" or "ground potential" refers to a reference voltage or potential against which all other voltages or potentials of an electronic circuit or Integrated circuit (IC) are defined or measured.

The present disclosure is directed to a current sensing circuit and method of operation that may be integrated with any switching device to provide current sensing. In one embodiment, a gallium nitride high-mobility transistor (GaN HEMT) is utilized as a switching device. In one example, the current flow through the GaN HEMT is sensed by a cascode MOSFET with a source coupled to the semiconductor substrate, obviating the need for a sense resistor. In a particular implementation, a GaN HEMT switching device is modeled as a normally-ON, high-voltage JFET device cascoded with a low-voltage main MOSFET device. In one embodiment, the current sensing circuit includes a current scaling block with a second, sense MOSFET that is monolithically fabricated on the same semiconductor substrate as the main MOSFET. In relation to the main MOSFET, the sense MOSFET is scaled down in size by a ratio of K:1, where K is an integer greater than one.

Persons of skill in the art will appreciate that this configuration does not require a floating source pin on the low-side sense MOSFET; instead, the main MOSFET and sense MOSFET both have their sources directly connected to the substrate. Removing the need for a floating low-side MOSFET provides the additional advantage of no requirement of a sense resistor. As is well known, sense resistors have a different temperature coefficient than MOSFETs. Also, implementing an accurate poly-silicon resistor on-chip typically requires a large area. Another advantage of using monolithic ratioed (scaled) dual low-side MOSFETs is that there is no difference (de-biasing) in the gate-source voltage of the sense-MOSFET with respect to the main-MOSFET on the low-side cascode MOSFET.

In one embodiment the current sensing circuit also includes a voltage-equalizer and a modulator block/circuitry. The modulator circuitry modulates the current flowing through the second sense MOSFET, which equalizes the drain-source voltage across both the main MOSFET device and the second sense MOSFET.

In one embodiment the main-MOSFET device and the sense-MOSFET are controlled by the same gate drive signal and under equal drain voltages; hence, as previously mentioned, both the main MOSFET device and the sense MOSFET operate with equal current densities. Due to the size ratio K, the currents flowing through the main MOSFET device and the sense MOSFET are each respectively proportional to their channel size. In one implementation, the reduced (scaled down) current flowing through the sense MOSFET is kept below a predetermined limit to maintain current scaling accuracy.

FIG. 1 is a circuit block diagram of an example current sensing circuit 190 for use with a semiconductor switching device 110 without current sensing, e.g., without either a sense FET, or using $R_{DS(on)}$ or an external sense resistor for current sensing. As shown, a switching voltage $V_{sw}$ 103 and switching current $I_{sw}$ 104 are applied to semiconductor switching device 110. In the example shown, a control/drive signal 105 (e.g., a pulse width modulated, PWM, signal) is applied to a control terminal of semiconductor switching device 110.

Figure 2:
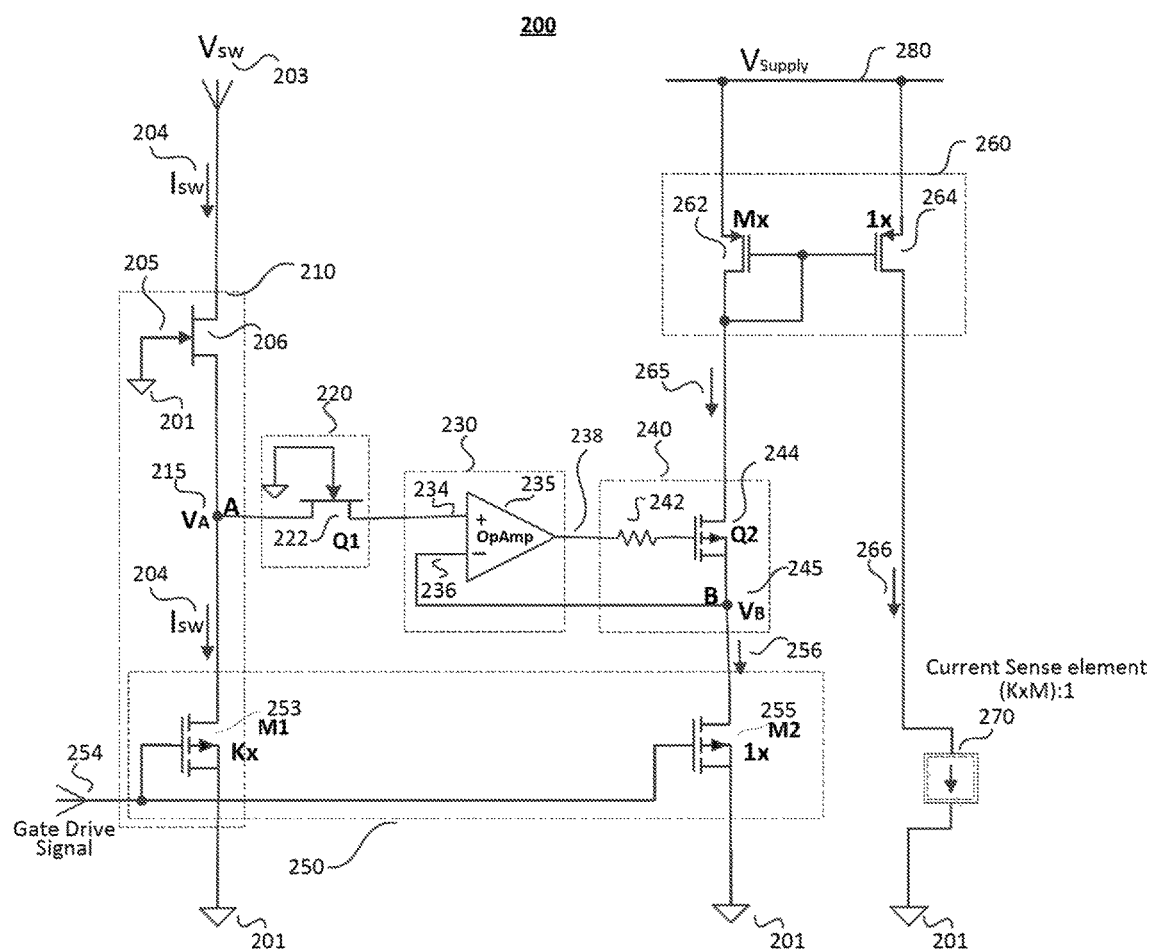
FIG. 2 is a detailed circuit schematic diagram of an example current sensing circuit with continuous linear-sensed current response.

In one implementation, semiconductor switching device 110 is a wideband GaN HEMT that may be modeled as a normally-ON high-voltage junction field-effect transistor (JFET) with a grounded control terminal, the JFET being cascoded with a low-voltage main MOSFET transistor that receives a gate drive signal (see FIG. 2). The switching current 104 may flow through a current scaling block 150 with a current transfer ratio K:1 ($K=I_A/I_B$; K>>1). In one example, the low voltage MOSFET portion in cascade with the GaN HEMT, may be included as part of current scaling block 150.

The input current signal 154 to current scaling block 150 is substantially the same as switching current 104. The output scaled down current signal 156 continuously and linearly follows input current signal 154. Linearity of output current signal 156 versus input current signal 154 is ensured by a modulator 140. In operation, modulator 140 may inject an equalizing signal 138 to output current signal 156 of current scaling block 150. An internal IC voltage supply $V_{supply}$ 180 provides a supply current 165 which, after being modulated by modulator 140, forms output current signal 156.

Voltage equalizer 130 is shown having a first input coupled to node A, and a second input coupled to node B, thereby respectfully receiving voltages $V_A$ and $V_B$. In operation, voltage equalizer block 130 generates an equalizing signal 138 input to modulator 140 that modulates current signal 165 such that voltage $V_B$ at node B tracks and is substantially equal to voltage $V_A$ at node A. For applications where the first input terminal of voltage equalizer block 130 may be susceptible to any possible high voltage pulses or spikes present at input node $V_A$ (either transient or normal), an optional high voltage blocker circuit 120 may be added (as shown) to prevent possible damage to the first input terminal of voltage equalizer 130.

Persons of skill in the art will appreciate that there is a practical limit to the current scaling ratio provided through current scaling circuit block 150. In the case where a very high current reduction (large K value) is desired, then one or more current mirror stages may be added at the output stage. By way of example, the circuit block diagram of FIG. 1 shows a current mirror 160 having a current ratio M:1 included in the connection path between voltage supply 180 and modulator 140. Hence, in the example shown, the total ratio of the switch current $I_{sw}$ (104) to the sense current (current sense signal 166) is increased to (K×M):1. This means that the sense current 166 flowing through sense MOSFET 170 is a multiple of the two factors K and M. Note that in one embodiment M=1, whereas in other embodiments M is an integer greater than one. Note further that all signals shown in FIG. 1 are referenced to ground potential 101.

FIG. 2 is a detailed circuit schematic diagram of an example current sensing circuit with continuous linear-sensed current response to a main switch current 204. In the example shown in FIG. 2, the switching device 210 includes a GaN HEMT represented by a high-voltage JFET 206 that is cascoded (in series) with a low-voltage MOSFET 253 (e.g., silicon MOSFET). Control terminal 205 of JFET 206 is coupled to ground potential 201, which keeps JFET 206 operating as a normally-ON device that may buffer the high switching voltage across the cascoded low-voltage MOSFET 253. An optional high-voltage blocker circuit 220, which in one example consists of a normally-ON JFET switch Q1 222 having its control terminal grounded, is shown coupled to node $V_A$ 215. High-voltage blocker circuit 220 may prevent harmful effects and protect against high potential damage on voltage equalizer 230.

Low-voltage MOSFET 253 is part of a monolithic current scaling circuit block 250 that consists of two MOSFET switches 253 and 255 that receive the same gate/drive signal 254 on their control terminals. Monolithic MOSFET switches 253 and 255 both have the same characteristic parameters, but are sized differently to realize a K:1 current ratio.

The drain voltages of MOSFET switches 253 and 255, $V_A$ 215 and $V_B$ 245, respectively, are forced to remain equal through modulation of the current 256 flowing through MOSFET switch 255. Modulator 240 modulates current 256. Fixing the voltages to be equal across MOSFET switches 253 and 255 means that the current densities through the respective channels of MOSFET switches 253 and 255 are equal. As a result the total current through each of MOSFET switches 253 and 255 is proportional to their respective channel sizes (i.e., Width/Length of the MOSFET channel). As shown, the respective channel sizes of MOSFET switches 253 and 255 are designed to provide a current ratio of K:1, where K is an integer greater (typically orders of magnitude greater) than 1.

In the example of FIG. 2, circuit block 230 is an operational amplifier (OpAmp) that functions as a voltage equalizer. OpAmp 230 receives drain voltage signals $V_A$ 215 and $V_B$ 245 at positive (+) and negative (−) input terminals 234 and 236 from MOSFET switches 253 and 255, respectively. In one embodiment, if a voltage higher than about 20-25 V appears on node $V_A$ 215, a high-voltage blocker circuit 220 may optionally be connected between +OpAmp input terminal 234 and node A. As shown in FIG. 2, high-voltage blocker circuit 220 may be implemented by a normally-ON JFET switch Q1 222 having its control terminal grounded to protect against potential damage to +OpAmp input terminal 234.

The equalizing signal 238 output from OpAmp 235 is shown coupled to a resistor 242 at the input of modulator 240. The other end of resistor 242 is connected to the control terminal (gate) of MOSFET Q2 244. In this configuration, current flow through MOSFET Q2 244, which operates in a linear mode, is modulated through equalizing signal 238 that is applied to control terminal of Q2 244. In another embodiment, MOSFET Q2 244 may be replaced by a bipolar junction transistor (BJT) or other types of field-effect transistors. As shown, equalizing signal 238 controls the voltage drop across the main terminals of MOSFET Q2 244 to force voltage $V_B$ at node B to be equal to voltage $V_A$ at node A. Equalization of node A and node B voltages, $V_A$ and $V_B$, across monolithic MOSFET transistors M1 253 and M2 244, which receive same gate drive signal 254, forces the current densities in MOSFET transistors M1 253 and M2 244 to be equal. This results in the respective current flow through MOSFET transistors M1 253 and M2 244 to be proportional to their selected/designed size ratio. In one example, current flow through MOSFET M2 244 is scaled down to 1/K times to that of flow through MOSFET M1 253.

Continuing with the example of FIG. 2, scaled down current 265 (which is the same as current 256 flowing through MOSFET M2 244, may flow through a current mirror 260 coupled to voltage supply $V_{supply}$ 280. In one example current mirror 260 comprises a first side coupled to node B, and a second side coupled to a current sense element 270. In the example shown, the current mirror comprises PMOS transistors 262 and 264, which share a common gate node and are appropriately sized to provide current mirror ratio M:1, where M is an integer greater than or equal to 1. This means that a sense current 266 flowing through PMOS transistor 264 (the second side of the current mirror) is reduced by a factor M as compared to current 265 flowing through PMOS transistor 262 (the first side of the current mirror). Note that a current sense element or component 270 may be used to detect/monitor the sense current 266. Sensing element/component 270 may comprise a current monitoring or protection block in controller. Altogether, the total current reduction as between switch current $I_{sw}$ 204 and sense current 266 is equal to K×M. It is appreciated that in certain high switching current applications additional cascoded current mirror stages may be added to further reduce the scaled down sensing current.

Figure 3:
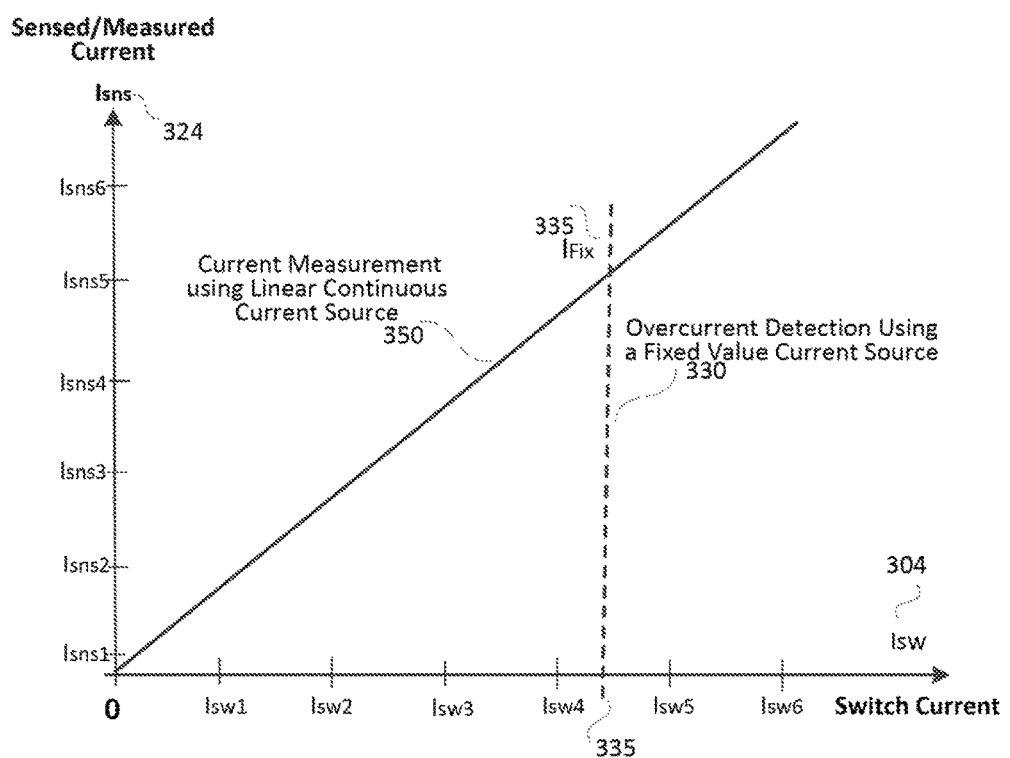
FIG. 3 is an example graph the graph shoring a linear relationship of the sensed current versus the main switch current.

FIG. 3 is an example graph the graph showing a linear relationship of the sensed current versus the main switch current for the example embodiments of FIGS. 1 & 2. Persons of skill in the art will appreciate that the linear current relationship shown by line 350 extends beyond a switch current level 335 (as shown by dashed line 330), which represents a point of overcurrent detection in a prior art approach that uses a fixed value current source. Past approaches relying upon fixed value current sources to represent current threshold/limit of the switching device are typically unable to maintain a linear response below or above current $I_{FIX}$ 335.

Persons of skill in the art will understand that the disclosed subject matter may be implemented by different versions and varieties. Switching device may consist of any discrete or integrated Si, SiC, GaN or other types of high electron mobility semiconductor switches.

The above description of illustrated example embodiments, including what is described in the Abstract, are not intended to be exhaustive or to be limitation to the precise forms or structures disclosed. While specific embodiments and examples of the subject matter described herein are for illustrative purposes, various equivalent modifications are possible without departing from the broader spirit and scope of the present invention. Indeed, it is appreciated that the specific example currents, voltages, resistances, device sizes, etc., are provided for explanation purposes and that other values may also be employed in other embodiments and examples in accordance with the teachings of the present invention.

I claim:

1. An integrated circuit (IC) for sensing a main current flowing through a transistor device, the IC comprising:
   a substrate;
   a current scaling circuit that includes first and second MOSFET devices, the first MOSFET device having a drain coupled to the transistor device at a first node and a source coupled to the substrate, the second MOSFET device having a source coupled to the substrate and a drain coupled to a second node, the first and second MOSFET devices each have a gate that is commonly coupled to receive a gate drive signal, the first MOSFET device having a channel size that is K times larger, where K is an integer greater than 1, as compared to the second MOSFET device, thereby producing a current ratio of K:1 between the first and second MOSFET devices in operation; and circuitry coupled to the first and second nodes which equalizes a voltage across both the first MOSFET device and the second MOSFET device.

2. The IC of claim 1 further comprising a current mirror having a first side coupled to the second node, and a second side, a secondary current flowing through the first side and a sense current flowing through the second side of the current mirror.

3. The IC of claim 1 wherein the sources of the first and second MOSFET devices are connected directly to the substrate.

4. The IC of claim 1 wherein the circuitry comprises an equalizer circuit having a first input coupled to the first node and a second input coupled to the second node, the equalizer circuit outputting an equalizer signal in response to a voltage difference across the first and second inputs.

5. The IC of claim 4 wherein the circuitry further comprises a modulator circuit coupled to receive the equalizer signal and, responsive to the equalizer signal, modulate a secondary current flowing through the second MOSFET device to equalize the voltage across both the first MOSFET device and the second MOSFET device.

6. The IC of claim 2 wherein the first side of the current mirror includes a first PMOS transistor coupled between a voltage supply and the second node, the second side of the current mirror includes a second PMOS transistor coupled to the voltage supply, the first and second PMOS transistors each having a gate commonly coupled to the second node.

7. The IC of claim 6 wherein the first PMOS transistor has a size that is M times larger, where M is an integer greater than or equal to 1, as compared to the second PMOS transistor, thereby producing a current ratio of M:1 between the first and second PMOS transistors in operation.

8. The IC of claim 7 wherein a total ratio of the main current to the sense current is (K×M):1.

9. The IC of claim 2 wherein the current mirror further comprises one or more additional cascoded current mirror stages.

10. The IC of claim 4 wherein the equalizer circuit comprises an operational amplifier.

11. The IC of claim 5 wherein the modulator circuit comprises a second transistor device coupled to the second node.

12. The IC of claim 11 wherein the second transistor device is a MOSFET that operates in a linear mode.

13. The IC of claim 11 wherein the second transistor device is a bipolar junction transistor (BJT) that operates in a linear mode.

14. The IC of claim 12 wherein the modulator circuit further includes a resistor having one end connected to the gate of the MOSFET and another end coupled to receive the equalizing signal.

15. The IC of claim 1 wherein the transistor device comprises a gallium nitride (GaN) high electron mobility FET (HEMFET).

16. The IC of claim 1 further comprising a current sense component coupled to receive the sense current.

17. The IC of claim 4 wherein the circuitry further comprises a high-voltage blocker circuit coupled between the first node and the first input of the equalizer circuit.

18. The IC of claim 17 wherein the high-voltage blocker circuit comprises a normally-ON high voltage JFET.

19. The IC of claim 17 wherein the first and second MOSFET devices are monolithic devices having substantially the same characteristic parameters.

20. The IC of claim 7 wherein M is an integer greater than 1.

* * * * *